United States Patent [19]

Yoneda et al.

[11] Patent Number: 5,437,727
[45] Date of Patent: Aug. 1, 1995

[54] APPARATUS FOR DRAWING PASTE PATTERN ON SUBSTRATE

[75] Inventors: Tomio Yoneda; Shigeru Ishida, both of Shimoinayoshi; Haruo Mishina, Ushiku, all of Japan

[73] Assignee: Hitachi Techno Engineering Co., Ltd., Tokyo, Japan

[21] Appl. No.: 917,934

[22] Filed: Jul. 24, 1992

[30] Foreign Application Priority Data

Jul. 24, 1991 [JP] Japan .................. 3-206154

[51] Int. Cl.⁶ .................. B05C 11/00; B05B 15/10
[52] U.S. Cl. .................. 118/669; 118/668; 118/680; 118/712; 156/356
[58] Field of Search .............. 118/664, 668, 670, 677, 118/679, 680, 712, 675, 676, 669; 156/356, 357

[56] References Cited

U.S. PATENT DOCUMENTS

| | | | |
|---|---|---|---|
| 4,291,642 | 9/1981 | Kolc .................. | 118/680 X |
| 4,728,378 | 3/1988 | Bianchi .................. | 156/356 X |
| 4,762,578 | 8/1988 | Burgin, Jr. et al. .............. | 118/712 X |
| 4,972,798 | 11/1990 | Ando et al. .................. | 118/680 X |
| 5,052,338 | 8/1991 | Maiorca et al. .................. | 156/356 X |

FOREIGN PATENT DOCUMENTS

0252742  2/1990  Japan .
2118867 11/1983  United Kingdom ........... 118/680

*Primary Examiner*—David A. Simmons
*Assistant Examiner*—M. Curtis Mayes
*Attorney, Agent, or Firm*—Antonelli, Terry, Stout & Kraus

[57] ABSTRACT

An apparatus for drawing a pattern of a photoresist on a substrate has a nozzle for discharging the paste and a substrate-supporting table movable along the X and Y-axes relative to the paste drawing opening of the nozzle. The nozzle is fixed to a Z-axis table which carries an optical displacement meter which measures the clearance between the substrate and the paste discharging opening. According to the results of the measurements, the Z-axis table is moved toward and away from the substrate so that the clearance is maintained at a desired distance. The optical displacement meter has a measuring point on the substrate. The measuring point is positioned so as not to interfere with the paste line which is drawn on the substrate with paste discharged from the nozzle.

5 Claims, 8 Drawing Sheets

APPARATUS FOR DRAWING PASTE PATTERN ON SUBSTRATE

BACKGROUND OF THE INVENTION

1. Field of the Invention

The present invention relates to an apparatus for painting a desired paste-pattern on a substrate by moving the substrate and a paste discharging nozzle relatively to each other and applying paste to the relatively moving substrate.

2. Description of Prior Art

Japanese Unexamined Patent Publication No. 2-52742 discloses an art in which a desired pattern of a resistance is formed on a substrate by discharging paste of the resistance from a paste discharging nozzle onto the substrate which is being moved relatively to the paste discharging nozzle. In such a conventional art, if the clearance between the substrate and the nozzle varies during a pattern drawing operation, the drawn paste pattern loses a desired sectional shape. Therefore, to maintain a predetermined clearance between the substrate and the nozzle, a sensor is employed to monitor the clearance therebetween. Preceding the nozzle moving relatively to the substrate, the sensor detects undulation (flatness) of a portion of the substrate to which the paste is applied. A predetermined clearance between the nozzle and the substrate is maintained based on the detected undulation, for example, by shifting the nozzle accordingly.

In the conventional art, such a sensor is fixed to a nozzle mounting means. If a paste pattern to be drawn is of one-way straight line so that the direction of the relative movement of the nozzle with respect to the substrate does not vary, a predetermined clearance between the nozzle and the substrate can be maintained since the sensor correctly detects undulations of the surface of the substrate. However, if a paste pattern to be drawn includes a curved portion or a rectangular portion so that the direction of the relative movement thereof varies, the sensor does not always precede the nozzle as viewed from the substrate moving with respect to the sensor and the nozzle. The sensor may be at a lateral side of or behind the nozzle according to the direction of the relative movement thereof which varies. Therefore, as the direction of the relative movement of the nozzle varies, a sensor's measuring point on the substrate, which is slightly spaced from a paste application point on the substrate, may come close to or move across a line of the paste pattern drawn even if the nozzle tip is not close to or facing the drawn line of the paste. In such a case, the pattern of the applied paste causes an error in the measurement of the clearance between the nozzle tip and the substrate. The detection of undulations of the substrate surface fails, resulting in an inaccurate measurement of the clearance between the nozzle and the substrate.

If the clearance between the nozzle and the substrate is not accurately measured, the drawn paste pattern will have varying sectional shapes because the amount of paste discharged from the nozzle per unit of time is constant. For example, at a position where the clearance between the substrate and the nozzle is close, the line of the paste pattern becomes wider. In a place where the clearance is larger, the past line becomes narrower. The height of the drawn paste pattern also varies accordingly. Thus, the paste pattern fails to have consistent sectional shapes.

SUMMARY OF THE INVENTION

The present invention is intended to solve the above problems and has an object to provide a paste pattern drawing apparatus which maintains a consistent width of a paste line during drawing of any desired paste pattern.

It is another object of the present invention to provide a paste pattern drawing apparatus which can maintain substantially the same height of a paste pattern during drawing of any desired paste pattern.

In one aspect of the present invention, there is provided a paste pattern drawing apparatus including a table having a top portion which supports a substrate; a paste container for containing paste of a photoresist; and a nozzle connected to the paste container and having a paste discharging opening which faces a top surface of the substrate supported by the table. At least one of the table and the nozzle is movable relative to the other in at least one of two directions perpendicular to each other. The paste is discharged from the nozzle while at least one of the table and the nozzle is moved relative to the other in at least one direction so that a desired pattern of the paste is drawn on the substrate. The apparatus further includes displacement measuring means for measuring a clearance between the substrate and the paste discharging opening of the nozzle; and clearance adjusting means for adjusting the clearance between the substrate and the paste discharging opening of the nozzle according to a result of the measurement provided by the displacement measuring means so that the clearance is maintained at a desired distance. The displacement measuring means has a measuring point on the substrate. The measuring point is positioned on a first line passing a paste applying point on the substrate to which the paste discharged from the nozzle falls and having a certain angle to a second line passing the paste applying point and being parallel to a direction of the relative movement of the substrate and the nozzle. The measuring point is spaced by a desired distance from the paste applying point.

According to a preferred embodiment of the present invention, the angle is substantially 45°. Further, it is preferable that the means for moving the displacement measuring means is so structured as to move the measuring point such that the measuring point precedes the paste applying point as viewed in the direction in which the nozzle is moved relative to the substrate.

According to another aspect of the present, the displacement measuring means of the paste pattern drawing apparatus of the class pointed out above includes control means and a plurality of clearance measuring means disposed around the nozzle to measure the clearance between the paste discharging opening of the nozzle and the substrate. The table and the nozzle are relatively movable in the two directions perpendicular to each other. The control means selectively operates the plurality of clearance measuring means according of the direction of the relative movement between the nozzle and the substrate, determines the value of the clearance between the paste discharging opening of the nozzle and the substrate based on the results of the measurements obtained from the selected clearance measuring means and inputs the thus determined clearance value to the clearance adjusting means.

According to still another aspect of the present invention, the clearance measuring means of the paste pattern drawing apparatus of the class pointed out above includes a supporting member movable back and forth relative to a surface of the substrate on the table, which surface faces the paste discharging opening of the nozzle. The displacement measuring means includes control means and clearance measuring means which has one measuring point on the surface of the substrate and which is mounted on the supporting member so as to be rotatable about the axis of the nozzle. The control means rotates the clearance measuring means about the nozzle according to the direction of a relative movement of the nozzle with respect to the substrate so that the measuring point is located at a position where the measuring point does not interfere with a paste line drawn on the substrate with paste discharged from the nozzle, i.e., where the measuring point neither moves across nor is placed on the paste line.

In a paste pattern drawing apparatus according to any of the above aspects of the present invention, since the measuring point of the displacement measuring means is positioned so as not to interfere with the paste line which is drawn on the substrate with paste discharged from the nozzle, any error does not occur in the measurement of the clearance between the nozzle and the substrate. Thus, the lines drawn with past to form a paste pattern have substantially uniform sectional shape along the entire lengths thereof.

The above and other objects, features and advantages of the present invention will become apparent from the following description with reference to the accompanying drawings.

DESCRIPTION OF THE PREFERRED EMBODIMENTS

Figure 1:
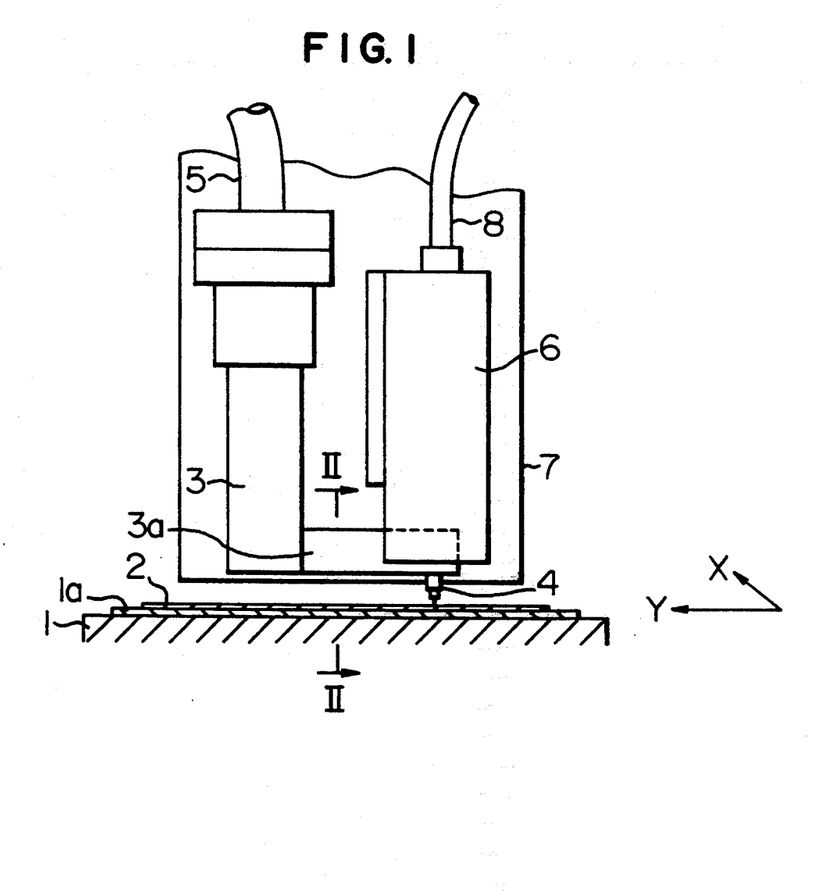
FIG. 1 is a side elevation of the essential portion of one embodiment of a paste pattern drawing apparatus according to the present invention.

Referring to FIG. 1, an X-Y axis table 1 of a paste pattern drawing apparatus according to one embodiment of the present invention has a substrate fastening portion 1a provided on the top surface thereof and is movable along the X and Y axes in the X-Y plane which is perpendicular to the drawing sheet. A substrate 2 is sucked and fastened to the X-Y table 1 by means of the substrate fastening portion 1a. A paste container 3 and an optical displacement meter 6 are mounted on a Z-axis table 7 which is movable perpendicularly to the top surface of the X-Y table 1 (along the Z-axis). The paste container 3 has a nozzle 4 provided at a bottom end portion thereof and is connected with a hose 5. Compressed air or compressed nitrogen gas is supplied through the hose 5 into the paste container 3 so as to discharge the paste contained in the paste container 3 from an paste discharging opening of the nozzle 4. The discharged paste is thus applied onto the substrate 2.

The optical displacement meter 6 measures the clearance between the substrate 2 and the paste discharging opening of the nozzle 4 (referred to as "the tip of the nozzle 4" hereinafter). The results of the measurements are sent as electric signals through a cable 8 to a control unit which is not shown.

To draw a desired paste pattern, the paste is discharged from the tip of the nozzle 4 while the X-Y table 1 is moved in the X-Y plane along both X and Y-axes or either one of them. Simultaneously, the optical displacement meter 6 measures the clearance between the tip of the nozzle 4 and the substrate 2. According to the results of the measurements, the Z-axis table 7 shifts along the Z-axis so as to maintain the clearance at a predetermined desired constant distance. Thus, paste lines forming a paste pattern will have a predetermined uniform sectional shape along the entire lengths of the lines.

Figure 2:
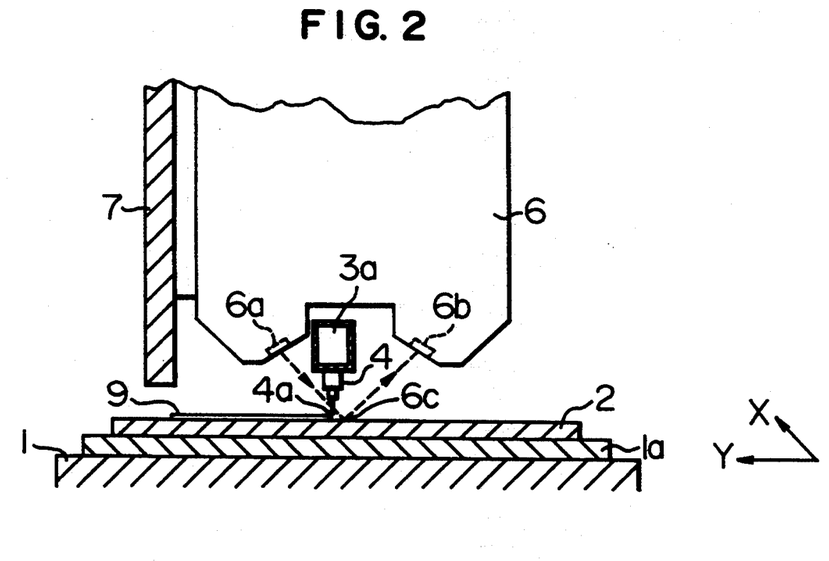
FIG. 2 is an enlarged sectional view taken along the line II—II of FIG. 1.

Referring to FIG. 2, the optical displacement meter 6 has a light emitting portion 6a and a light receiving portion 6b provided at the two opposing sides of the nozzle 4. The light emitting portion 6a irradiates the substrate 2 with a light beam at a predetermined angle with respect to the Z-axis, which is perpendicular to the top surface of the substrate 2. The light receiving portion 6b receives the light beam reflected by the substrate 2. The portion of the substrate irradiated with the light beam emitted from the light emitting portion 6a is named as a measuring point 6c. The light emitting portion 6a is set so that the measuring point 6c is in the vicinity of the position on the substrate to which the tip of the nozzle 4 is directed.

When the X-Y table 1 is moved in the X-Y plane and the paste 9 is discharged from the tip of the nozzle 4, the discharged paste 9 falls to a vicinity of the measuring point 6c on the substrate 2 (the point to which the paste 9 falls will be referred to as "a paste applying point" 4a hereinafter). Thus, a pattern of the paste 9 is formed on the substrate 2 as the X-Y table 1 is moved.

Figure 3:
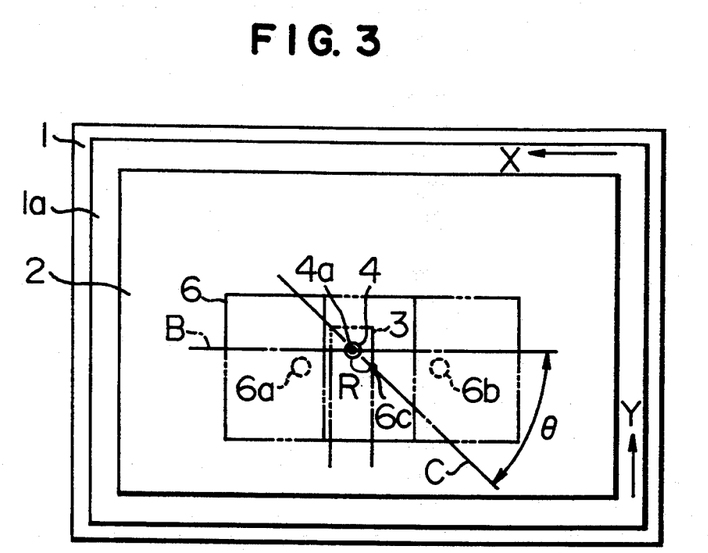
FIG. 3 is a plan view of a substrate, illustrating the positional relation between a paste applying point and a measuring point in the paste pattern drawing apparatus shown in FIGS. 1 and 2.

Referring to FIG. 3, the paste applying point 4a is positioned on a one-dot line B extending along the X-axis (in the direction indicated by the arrow X). A line segment connecting the light emitting portion 6a and the light receiving portion 6b is apart from and parallel to the one-dot line B. Thus, the nozzle 4 is not disposed between the light emitting portion 6a and the light receiving portion 6b and does not block the light from the light emitting portion 6a via the measuring point 6c on the substrate 2 to the light receiving portion 6b. To position the measuring point 6c and the paste applying point 4a as close to each other as possible, the nozzle 4 is connected to an end portion of a paste conveying duct 3a which horizontally extends from a bottom end portion of the paste container 3 to the vicinity of the measuring point 6c, as shown in FIG. 1.

The light emitting portion 6a and the light receiving portion 6b of the optical displacement meter 6 and the nozzle 4 are arranged such that the measuring point 6c is positioned on a one-dot line C which passes through the paste applying point 4a and has a predetermined angle $\theta$ to the one-dot line B. According to this embodiment, the angle $\theta$ is about 45°.

Figure 4:
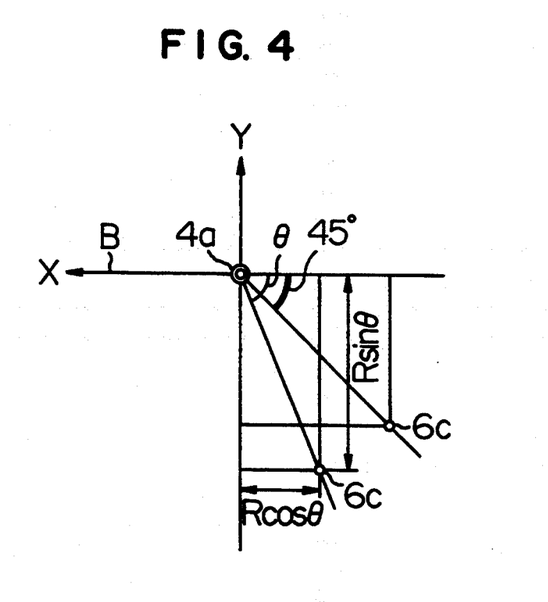
FIG. 4 illustrates distances between the paste applying points and the measuring points in the paste pattern drawing apparatus shown in FIGS. 1 and 2.

In such arrangement according to this embodiment, the components of the distance R between the paste applying point 4a and the measuring point 6c which are taken along the X and Y-axes (R cos$\theta$ and R sin$\theta$) are approximately equal. If there is any difference between the two components, such difference will be approximately equal to the error caused in the mounting of the optical displacement meter 6. Since the substrate 2 is moved along the X or Y-axis at a given moment, most of the lines forming the paste pattern on the substrate 2 are parallel to the X or Y-axis. Therefore, if the difference between R sin$\theta$ and R cos$\theta$ is substantially zero as stated above, the measuring point 6c will be positioned neither on the formed paste pattern nor close thereto regardless of whether the substrate 2 is moved along the X-axis or the Y-axis, as shown in FIG. 4. Thus, the clearance between the tip of the nozzle 4 and the substrate 2 can be accurately measured, so that the paste lines of the paste pattern will have a consistent sectional shape.

Referring to FIG. 4, if R sin$\theta$ > R cos$\theta$ and the substrate 2 is moved in the direction indicated by the arrow X, the distance (R sin$\theta$) between the measuring point 6c and the line B, which coincides with a locus of the tip of the nozzle 4, is greater than R sin 45°. In other words, the clearance between the tip of the nozzle 4 and the substrate 2 is measured at the measuring point 6c, which is farther from the nozzle tip than it is when $\theta$ is approximately 45°. If R sin$\theta$ < R cos$\theta$ and the substrate 2 is moved in the direction indicated by the arrow Y, the distance (R cos$\theta$) between the measuring point 6c and the line perpendicular to the line B, which coincides with a locus of the tip of the nozzle 4, is greater than R cos 45°. In other words, the clearance between the tip of the nozzle 4 and the substrate 2 is measured at the measuring point 6c, which is farther from the nozzle tip than it is when $\theta$ is approximately 45°. Thus, if $\theta \approx 45°$ and thus R sin$\theta$ − R cos$\theta \approx 0$, the measuring point 6c is positioned closer to the locus of the nozzle tip than in other cases regardless of whether the substrate 2 is moved along the X-axis or the Y-axis. Accordingly, the clearance between the tip of the nozzle 4 and the substrate 2 can be constantly measured with high accuracy.

When a photoresist paste pattern is formed according to the above described conventional art disclosed in Japanese Unexamined Patent Publication No. 2-52742, the amount of applied paste tends to vary causing varied resistances thereof. Therefore, to obtain a paste pattern having a predetermined resistance, an excessive amount of paste must be applied, and between the baking thereof and the formation of a printed wiring, the paste lines must be trimmed while the resistance thereof is monitored. On the other hand, according to the above embodiment of the present invention, such a trimming process is not required since the amount of paste applied per unit of time is consistent during the formation of a pattern, i.e., the paste lines forming the pattern have substantially the same sectional shape along the entire lengths of the lines.

Although the angle $\theta$ is about 45° according to this embodiment, the angle $\theta$ may be different from 45° as long as the angle $\theta$ does not cause an intolerable difference in the measuring point-nozzle tip distance when the substrate is moved along the X-axis and the Y-axis.

Figure 5:
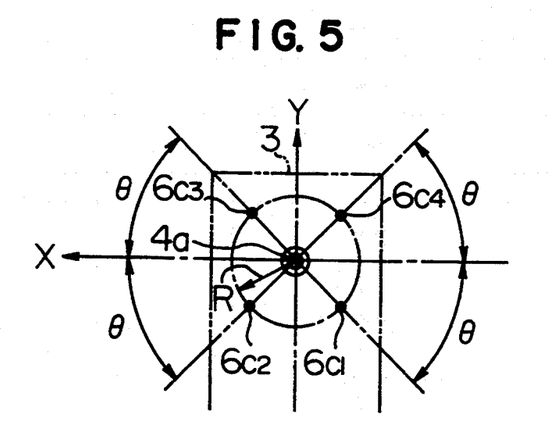
FIG. 5 illustrates locations of the measuring points in the paste pattern drawing apparatus shown in FIGS. 1 and 2.

In addition, as shown in FIG. 5, the measuring point 6c may be any point selected from four points 6c1, 6c2, 6c3 and 6c4, which are the intersecting points of a circle having a radius R about the paste applying point 4a and two lines each passing the paste applying point 4a and having a predetermined angle $\theta$ (e.g., $\theta = 45°$) with respect to the X-axis. As a matter of course, the radius R should be as small as possible.

Further, the apparatus may be constructed such that the measuring point 6c is shifted on the surface of the substrate 2. In such a construction, the X-Y table 1 may be moved in any direction on the X-Y plane and the position of the measuring point 6c is shifted according to the direction of the X-Y table 1 so as to always take a position on a line which passes the paste applying point 4a and extends at an angle of 45° to the direction of the movement of the X-Y table 1. By such positioning of the measuring point 6c, the clearance between the tip of the nozzle 4 and the substrate 2 can be accurately measured regardless of the direction of the movement of the substrate 2. The shift of the measuring point 6c may be either linear or rotational about the paste applying point 4a.

Figure 6:
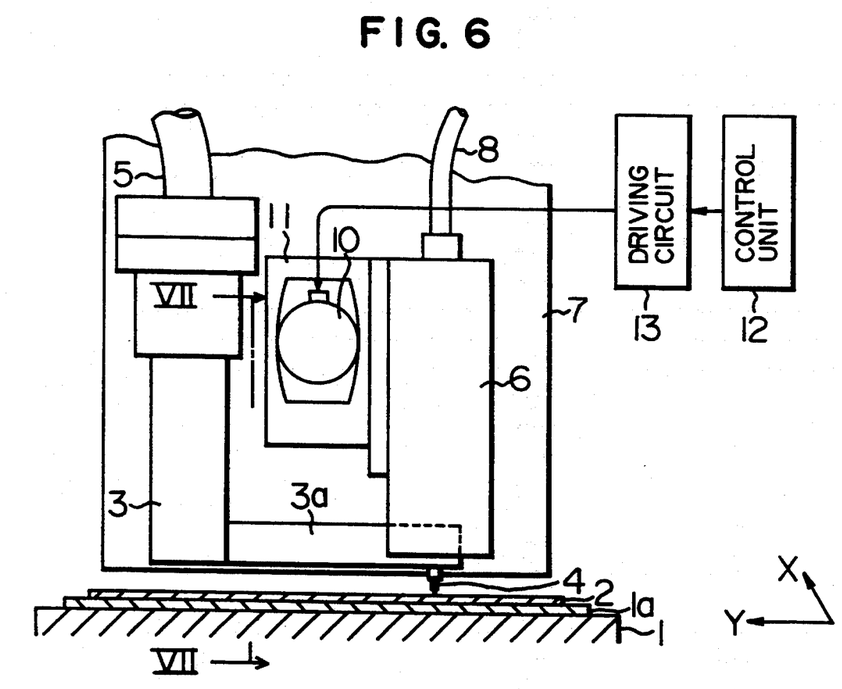
FIG. 6 is a side elevation of the essential portion of another embodiment of the paste pattern drawing apparatus according to the present invention.
Figure 7:
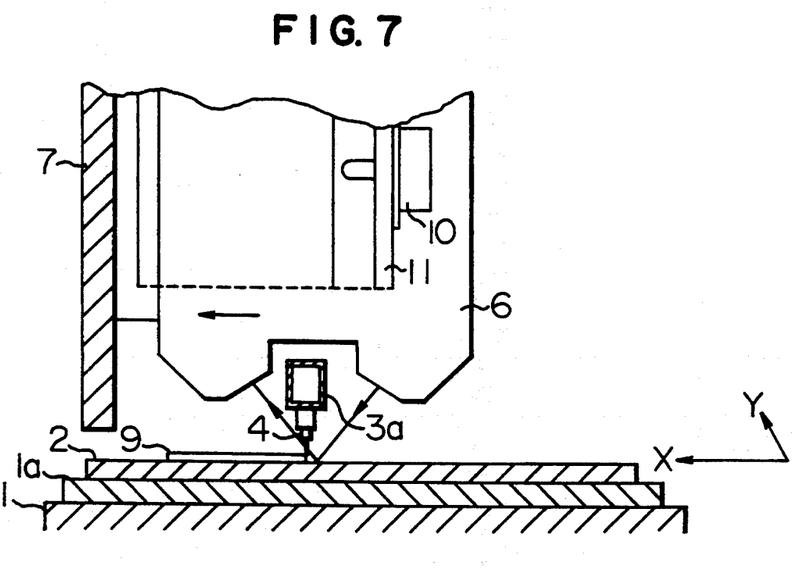
FIG. 7 is an enlarged sectional view taken along the line VII—VII of FIG. 6.

With reference to FIGS. 6 and 7, a paste pattern drawing apparatus according to another embodiment of the present invention will be described. Portions comparable to those of the foregoing embodiments are denoted by the same numerals, and the description of such portions will not be repeated.

A drive motor 10 and an X-axis shifting stage 11 are mounted on a Z-axis table 7 which also has a paste container 3, etc. The X-axis shifting stage 11 carries an optical displacement meter 6. The X-axis shifting stage 11 is movable on the surface of the Z-axis table 7 and parallel to the surface of the substrate 2. The drive motor 10 drives the X-axis shifting stage 11 and is driven by a driving circuit 13 which is controlled by a control unit 12.

Figure 8:
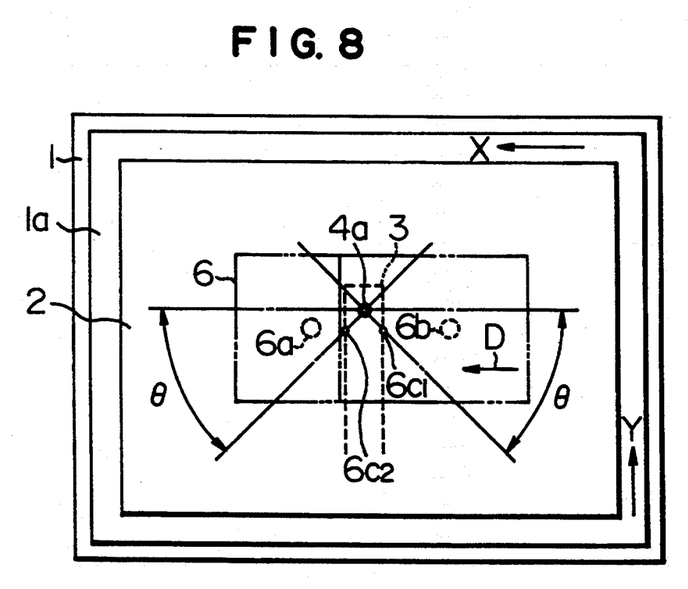
FIG. 8 is a plan view of a substrate, illustrating the positional relation between a paste applying point and two measuring points in the paste pattern drawing apparatus shown in FIGS. 6 and 7.

Referring to FIG. 8, when the control unit 12 sends a control signal to the driving circuit 13 so that the drive motor 10 moves the X-axis shifting stage 11, the optical displacement meter 6, carried by the X-axis shifting stage 11, is shifted in the direction indicated by the arrow D parallel to the X-axis so that the measuring point 6c is simultaneously shifted from a point 6c1 to a point 6c2.

Positioning of the measuring point 6c according to a pattern being drawn will be described with reference to FIG. 9.

A pattern is drawn along a solid line 14 in the direction indicated by arrows along the X-axis from an initial point I to a corner P (toward the right), along the Y-axis from the corner P to a corner N (upward), along the X-axis from the corner N to a corner W (toward the right), along the Y-axis from the corner W to a corner S (downward), along the X-axis from the corner S to a corner T (toward the left), along the Y-axis from the corner T to a corner V (upward), and along the X-axis from the corner V to an end point E (toward the left). The X and Y-axes are the same as in FIG. 8.

From the initial point I to the corner S, the measuring point 6c is positioned at the point 6c1, which is right and downward (as viewed on the drawings) of the paste applying point 4a (at an angle of approximately 45° from the X and Y-axes when viewed from the paste applying point 4a). The measuring point when positioned at the point 6c1 does not go across the drawn paste pattern when the direction of the pattern drawing is changed at the corners P, N and W. The measuring point 6c1 will cross the solid line 14 between the corners W and S when the paste applying point 4a moves along the solid line 14 from the corner N and comes close to the corner W. At this moment, however, paste is not yet applied along the solid line 14 between the corners W and S. Thus, no problem takes place.

When the paste applying point 4a reaches the corner S, the control unit 12 (shown in FIG. 6) outputs a control signal so that the measuring point 6c is shifted from the point 6c1 to a point 6c2 which is left and downward (as viewed in the drawing of the paste applying point 4a (at an angle of approximately 45° from the X and Y-axes as viewed from the paste applying point 4a). Thus, the measuring point 6c2 will not cross the drawn paste pattern while paste is applied along the solid line 14 from the corner S to the end point E. If the measuring point 6c remains at the point 6c1, which is right and downward of the paste applying point 4a, the measuring point 6c1 will cross the painted paste pattern when the direction of the pattern drawing movement of the nozzle 4 is changed at the corners T and V. Such crossing will cause errors in the measurements of the clearance between the tip of the nozzle 4 and the substrate 2.

In this manner, the clearance between the tip of the nozzle 4 and the substrate 2 can be accurately measured at real time from the initiation to the end of the drawing of a desired paste pattern without the measuring point 6c crossing the drawn paste lines.

Figure 10:
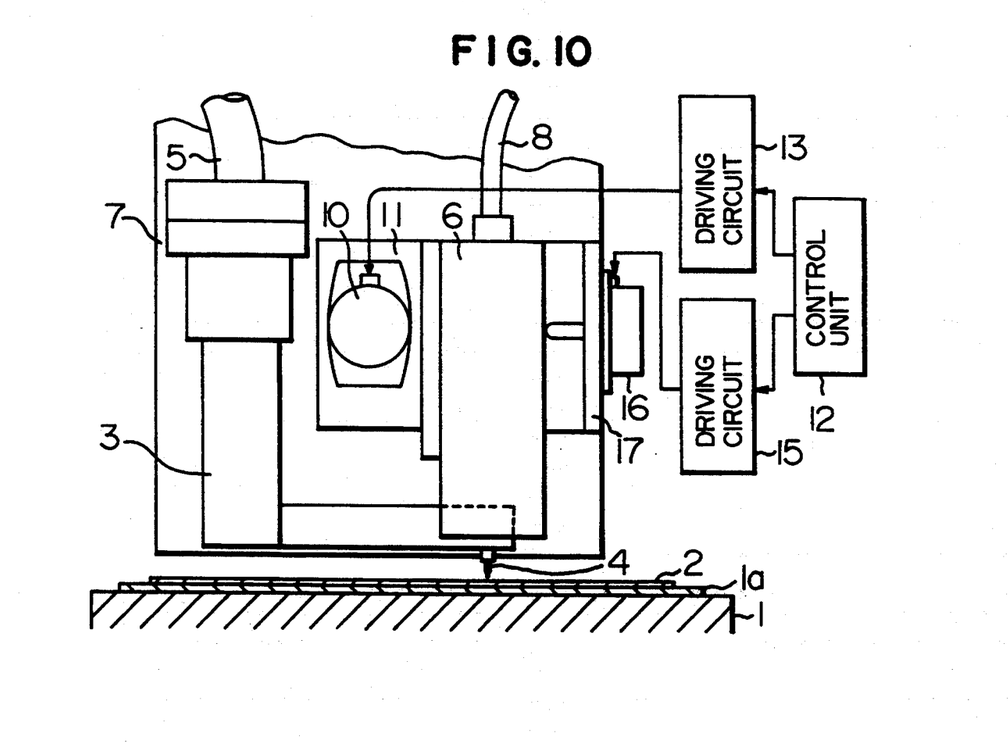
FIG. 10 is a side elevation of the essential portion of still another embodiment of the paste pattern drawing apparatus according to the present invention.

FIG. 10 illustrates the essential portions of still another embodiment of the paste pattern drawing apparatus according to the present invention. In the figure, the portions thereof equivalent to those shown in FIG. 6 are denoted by the same numerals.

According to this embodiment, a drive motor 10 and an X-axis shifting stage 11 are mounted on a Z-axis table 7, which carries a paste container 3, etc. A second drive motor 16 and a Y-axis shifting stage 17 are mounted on the X-axis shifting stage 11. The Y-axis shifting stage 17 carries an optical displacement meter 6. As in the foregoing embodiment shown in FIGS. 6 and 7, the X-axis shifting stage 11 is movable on the surface of the Z-axis table 7 and parallelly to the X-axis of an X-Y table 1 carrying a substrate 2. The drive motor 10, which moves the X-axis shifting stage 11, is driven by a driving circuit 13 which is controlled by a control unit 12. The Y-axis shifting stage 17 is movable parallelly to the surface of the substrate 2 and perpendicularly to the X-axis of the X-Y table 1, i.e., parallelly to the Y-axis of the X-Y table 1. The second drive motor 16, which moves the Y-axis shifting stage 17, is driven by a second driving circuit 15 which is controlled by the control unit 12.

Referring to FIGS. 8 and 10, when the control unit 12 sends a control signal to the driving circuit 13 so that the drive motor 10 drives the X-axis shifting stage 11, the optical displacement meter 6 is shifted in the direction indicated by the arrow D parallel to the X-axis and, thereby, the measuring point 6c is shifted in the same direction. When the control unit 12 sends a control signal to the second driving circuit 15 so that the second drive motor 16 drives the Y-axis shifting stage 17, the optical displacement meter 6 is shifted perpendicularly to the direction indicated by the arrow D and, thereby, the measuring point 6c is also shifted perpendicularly to the direction indicated by the arrow D. By such operations of the X-axis and Y-axis shifting stages 11 and 17, the measuring point 6c can be positioned at any of the four points 6c1, 6c2, 6c3 and 6c4 around the paste applying point 4a, as shown in FIG. 5.

Figure 9:
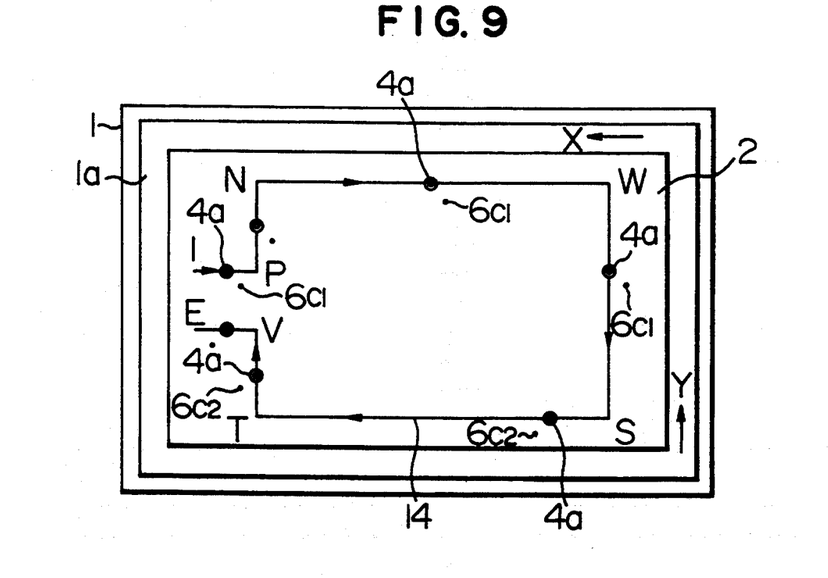
FIG. 9 is a plan view of a substrate, illustrating the positional relation of the measuring points with respect to the paste applying point, in accordance with the directions of movements of the substrate during pattern drawing performed by the paste pattern drawing apparatus shown in FIGS. 6 and 7.
Figure 11:
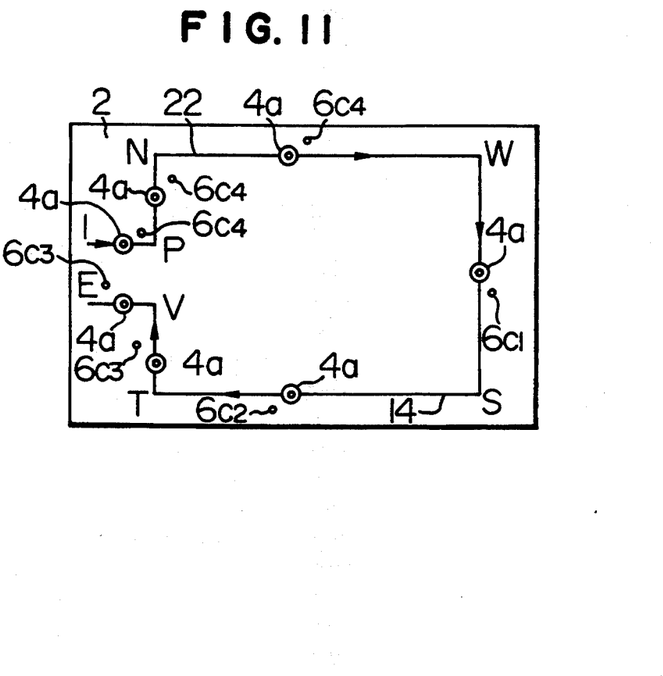
FIG. 11 is a plan view of a substrate, illustrating the positional relation of the measuring points with respect to the paste applying point, in accordance with the directions of movements of the substrate during pattern drawing performed by the paste pattern drawing apparatus shown in FIG. 10.

FIG. 11 illustrates shifting of measuring point 6c according to this embodiment when the paste pattern to be drawn is the same as in FIG. 9. The four points 6c1, 6c2, 6c3 and 6c4 shown in FIG. 11 correspond to the four measuring points shown in FIG. 5.

Referring to FIG. 11, from the initial point I to the corner W, the measuring point 6c is positioned at the point 6c4 which is right and upward (as viewed on the drawing) of the paste applying point 4a (at an angle of approximately 45° to the X and Y-axes as viewed from the paste applying point 4a). The measuring point 6c positioned at the point 6c4 will not cross the drawn paste line when the direction of the pattern drawing is changed at the corners P and N. The measuring point 6c4 will cross the solid line 14 between the corners P and N when the paste applying point 4a moves along the solid line 14 from the initial point I and comes close to the corner P. At this moment, however, the paste is not yet applied along the solid line 14 between the corners P and N.

When the paste applying point 4a reaches the corner W, the control unit 12 (shown in FIG. 10) outputs a control signal to the second driving circuit 15 so that the measuring point 6c is shifted along the Y-axis and outside the solid line 14 to the point 6c1 which is right and downward of the paste applying point 4a (at an angle of approximately 45° to the X and Y-axes as viewed from the paste applying point 4a). The thus positioned measuring point 6c1 will not cross the paste line drawn between the corners W and S. When the paste applying point 4a reaches the corner S, the control unit 12 outputs a control signal to the driving circuit 13 so that the measuring point 6c is shifted along the X-axis and outside of the solid line 14 to the point 6c2 which is left and downward of the paste applying point 4a (at an angle of approximately 45° from the X and Y-axes as viewed from the paste applying point 4a). The thus positioned measuring point 6c2 will not cross the paste line drawn between the corners S and T. When the paste applying point 4a reaches the corner T, the control unit 12 outputs a control signal to the second driving circuit 15 so that the measuring point 6c is shifted along the Y-axis and outside the solid line 14 to the point 6c3 which is left and upward of the paste applying point 4a (at an angle of approximately 45° from the X and Y-axes as viewed from the paste applying point 4a). The thus positioned measuring point 6c3 will not cross the paste line drawn between the corner T and the end point E. The measuring point 6c3 will cross the solid line 14 between the corner V and the end point E when the paste applying point 4a moves along the solid line 14 from the corner T and comes close to the corner V. At this moment, however, the paste is not yet applied along the solid line 14 between the corner V and the end point E.

The measuring point 6c shifted in the described manner always precedes the paste applying point 4a during the relative movement thereof on the substrate 2. If the light emitting portion 6a and the light receiving portion 6b of the optical displacement meter 6 are arranged on a line parallel to the X-axis as shown in FIGS. 3 and 8, the light from the light emitting portion 6a is blocked by the tip of the nozzle 4 when the measuring point 6c is shifted at the corner from the point 6c4 to the point 6c1 in FIG. 11. In such a case, the output signal of the optical displacement meter 6 should preferably be switched off so that a control system which controls the Z-axis table 7 will not malfunction.

If the light path is shifted under the tip of the nozzle 4 when the measuring point 6c is shifted, it is not necessary to switch off the output signal of the optical displacement meter 6.

According to this embodiment, the measuring point 6c is so positioned with respect to the paste applying point 4a as to always precede the paste applying point 4a as viewed from the tip of the nozzle 4 moving relative to the substrate 2 and take the same position with respect to the paste applying point 4a. Thus, the positional condition in measurement of the clearance between the tip of the nozzle 4 and the substrate 2 is maintained constant. Further, the measuring point 6c does not cross the drawn paste line. Therefore, the clearance between the tip of the nozzle 4 and the substrate 2 can be measured with high accuracy.

The embodiment shown in FIG. 10 may be modified such that the drive motor 10, the X-axis shifting stage 11 and the driving circuit 13 are omitted so that the optical displacement meter 6 mounted on the Y-axis shifting stage 17 is movable solely along the Y-axis. In such a construction, the operation is similar to that of the embodiment shown in FIG. 6. The clearance between the tip of the nozzle 4 and the substrate 2 is measured without the measuring point 6c crossing a drawn paste lines during the drawing of the paste patterns. Therefore, favorable paste patterns can be obtained.

Figure 12:
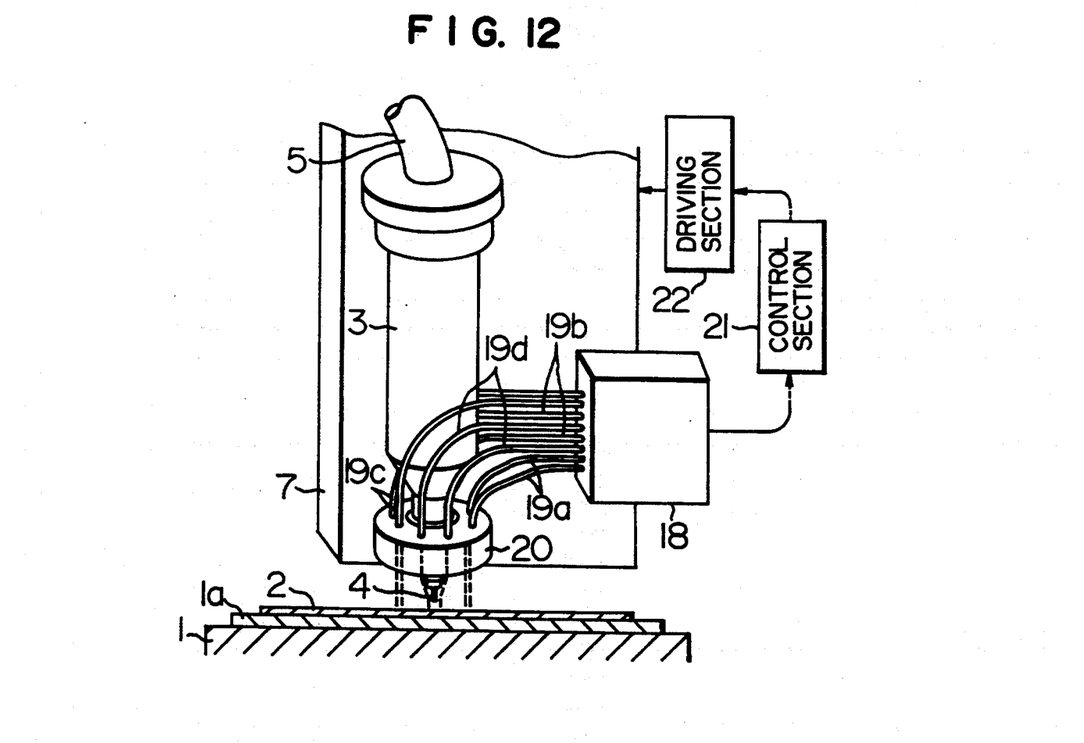
FIG. 12 is a side elevation of the essential portion of a further embodiment the paste pattern drawing apparatus according to the present invention.

FIG. 12 is a side view of the essential portions of a further embodiment of the paste pattern drawing apparatus according to the present invention. Portions in the figure comparable to those shown in FIG. 1 are denoted by the same numerals and the description of such portions will not be repeated.

An optical fiber type displacement meter 18 is mounted on a Z-axis table 7. Four pairs of fibers 19a, 19b, 19c and 19d extend from the fiber type displacement meter 18 and have end portions supported by a fiber supporting drum 20 which is connected at its central portion to a lower end portion of a paste container 3. The end portions of the fibers are arranged at equal intervals on a circle having its center disposed on the axis of the tip of the paste container 3 and face a substrate 2. The optical fiber type displacement meter 18 emits light which travels though the pairs of fibers 19a, 19b, 19c and 19d to the surface of the substrate 2, receives the reflected light through the fiber pairs and then outputs the results of measurements obtained using the pairs of fibers 19a, 19b, 19c and 19d. A control section 21 takes one or two of the measurement outputs to calculate the clearance between the tip of a nozzle 4 and the substrate 2. A driving section 22 comprising a motor is controlled according to the calculated clearance value so as to move the Z-axis table along the Z-axis.

The measuring points are the points on the substrate 2 which are irradiated with the light beams from the end portions of the pairs of fibers 19a, 19b, 19c and 19d. An example of arrangement of the measuring points is shown in FIG. 5. The measuring points 6c1, 6c2, 6c3 and 6c4 in FIG. 5 are the measuring points of the pairs of fibers 19a, 19b, 19c and 19d, respectively. According to the direction of the relative movement of the nozzle 4 with respect to the substrate 2, the control section 21 (shown in FIG. 12) selects and takes one of the four measurements obtained using the measuring points 6c1, 6c2, 6c3 and 6c4. As in the foregoing embodiment shown in FIGS. 10 and 11, the measuring point 6c always precedes the paste applying point 4a during the application of the paste, achieving substantially the same effects as in the foregoing embodiments.

Figure 13:
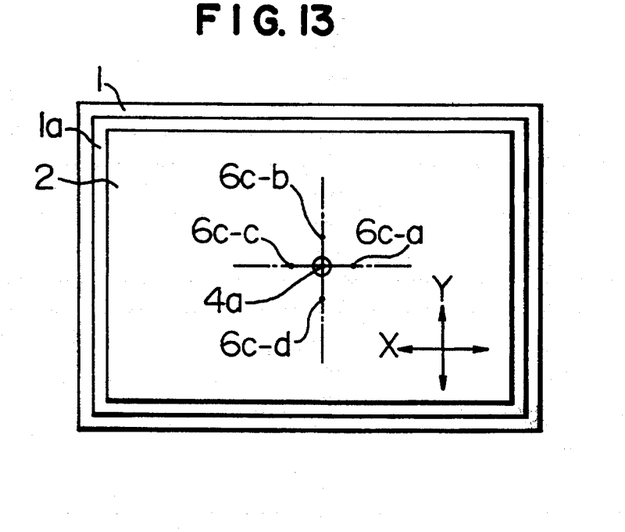
FIG. 13 is a plan view of a substrate, illustrating the positional relation of measuring points with respect to a paste applying point in the paste pattern drawing apparatus shown in FIG. 12.

FIG. 13 illustrates another example of the positional relation of the measuring points according to the embodiment shown in FIG. 12.

In FIG. 13, points 6c-a to 6c-d are the measuring points of the pairs of fibers 19a to 19d, respectively. The points 6c-a to 6c-d are on the circle having its center disposed at the paste applying point 4a. The points 6c-a and 6c-c are on a line extending through the paste applying point 4a and parallel to the X-axis. The points 6c-b and 6c-d are on a line extending through the paste applying point 4a and parallel to the Y-axis.

When the movement of the nozzle 4 relative to the substrate 2 is along the Y-axis, the control section 21 selects and takes the measurements obtained using the two points 6c-a and 6c-c which are at the opposite sides of the paste applying point 4a. Then, the control units 21 sends the mean of the two measurements as the value of the clearance between the tip of the nozzle 4 and the substrate 2 to the driving section 22 (shown in FIG. 12) which accordingly moves the Z-axis table 7 along the Z-axis. When the movement of the nozzle 4 relative to the substrate 2 is along the X-axis, the control section 21 selects and takes the measurements obtained using the other two points 6c-b and 6c-d which are at opposite sides of the paste applying point 4a. Then, the control section 21 sends the mean of the two measurements as the value of the clearance between the tip of the nozzle 4 and the substrate 2 to the driving section 22 (shown in FIG. 12) which accordingly moves the Z-axis table 7.

By using the mean of the two measurements obtained using two measuring points which are positioned symmetrically about the paste applying point 4a, accurate measurements of the clearance between the tip of the nozzle 4 and the substrate 2 can be constantly obtained, for example, even if the surface of the substrate 2 has an slope near the paste applying point 4a.

Although the optical displacement meter 6 is linearly shifted in the foregoing embodiments described with reference to FIGS. 1 to 11, the optical displacement meter 6 may be rotatably supported on the Z-axis table 7 so as to be rotated around the axis of the nozzle 4 along the circumference of a circle of a radius of R having its center disposed at the paste applying point 4a. Such embodiment will be described with reference to FIG. 14. A bracket 25 is mounted on a Z-axis table 7. An outer race of a bearing 26 is rigidly connected to the bracket 25. An inner race of the bearing 26 is connected at its top portion with a spider 27 and at its bottom portion with an L-shaped mounting member 28. The spider 27 is connected by means of a shaft 29 to a motor 30 which is mounted on the Z-axis table 7. An optical displacement meter 6 and a paste container 3 having a nozzle 4 at its bottom portion are mounted on the mounting member 28 coaxially with motor 30.

Figure 14:
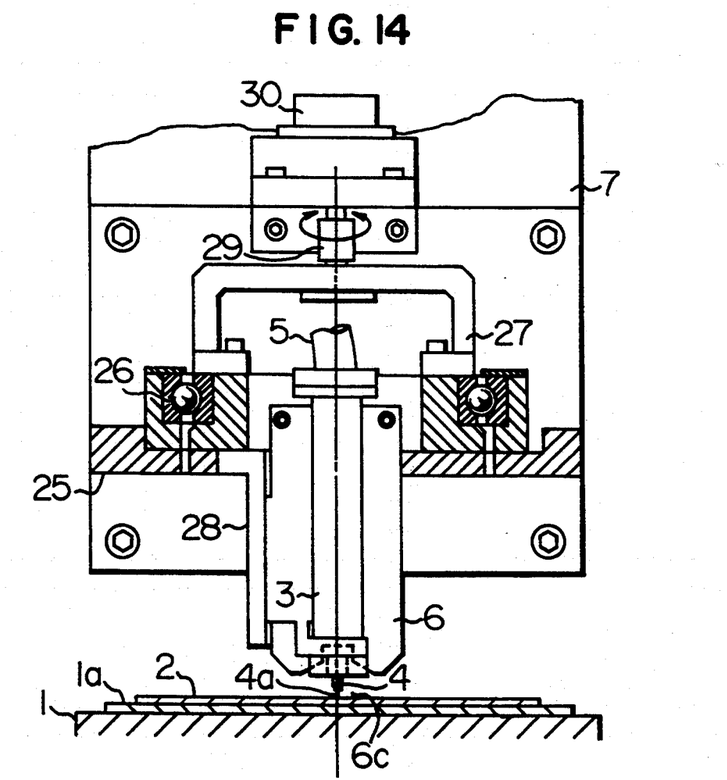
FIG. 14 is a partly sectional front view of the essential portion of still further embodiment of the paste pattern drawing apparatus according to the present invention.

When the motor 30 is operated, the rotation of the motor 30 is transmitted through the shaft 29, the spider 27 and the inner race of the bearing 26 to the mounting member 28 so that the measuring point 6c of the optical displacement member 6 rotates along the circle having a radius R and its center disposed on the center axis (indicated by a one-dot line) of the paste container 3, i.e., at the paste applying point 4a. Therefore, the measuring point 6c can be positioned at any one of the four points 6c1 to 6c4 shown in FIG. 5 according to the direction of the movement of the nozzle 4 relative to the substrate 2. Further, the measuring point 6c may be positioned not only at the four points 6c1 to 6c4 but also at any point on the circle based on the rotational angle of the motor 30.

Although, in the foregoing embodiments, the X-Y table 1 is moved along the X-axis and/or the Y-axis in order to provide relative movements between the X-Y table 1 and the nozzle 4, the nozzle 4 may be moved instead of the X-Y table 1 along the X-axis and/or the Y-axis.

While two measuring points are used at a time to measure the clearance between the tip of the nozzle 4 and the substrate 2 according to the embodiment shown in FIGS. 12 and 13, another number of the measuring points may be used. Further, any desired method may be used to select measuring points for the measurement as long as the selected measuring points will not move across or come too close to a drawn paste pattern. In addition, although all the paste patterns used in the described embodiments are solely formed of straight lines, paste patterns including curved lines, e.g., at corners, can be drawn without the measuring points coming too close to or crossing a drawn paste line if suitable measuring points are used at such curved portions.

While, according to the foregoing embodiments, the measuring points are shifted parallelly or perpendicularly to the direction of the movement of the nozzle 4, the measuring points may be shifted diagonally to the direction of the movement of the nozzle 4 according to the following embodiment.

Figure 15:
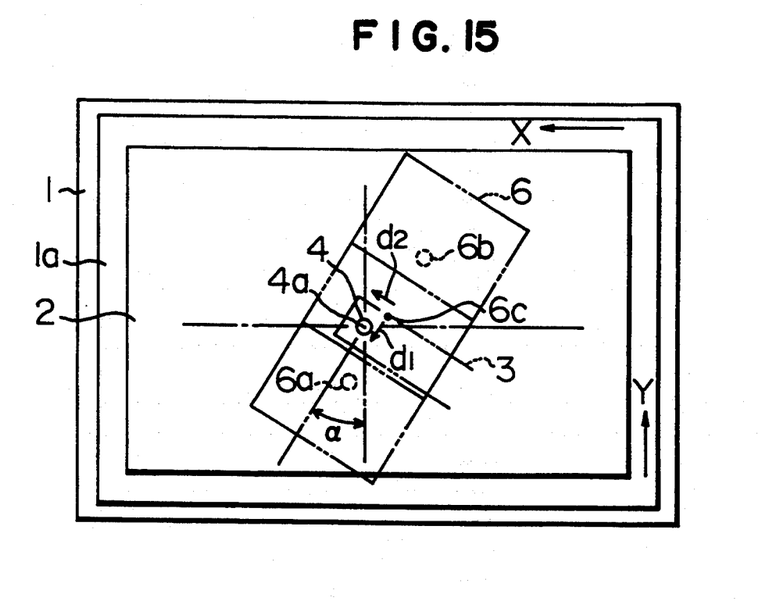
FIG. 15 is a plan view of a substrate, illustrating the positional relation between a paste applying point and measuring points in still another embodiment of the paste pattern drawing apparatus according to the present invention.

As shown in FIG. 15, an optical displacement meter 6 is diagonally arranged at an angle $\alpha$ to the direction X (or Y) of the movement of the nozzle 4 or to the direction Y (or X) perpendicular thereto. Such arrangement of the optical displacement meter 6 may become clear if compared with the arrangement shown in FIG. 3.

The optical displacement meter 6 is shiftable longitudinally or laterally (in the direction indicated by an arrow d1 or d2). It is assumed that the optical displacement meter 6 is shifted longitudinally in the direction indicated by the arrow d1. Assume two lines, one passing the initial measuring point 6c in the direction indicated by the arrow d1, and other passing the paste applying point 4a in the direction perpendicular to the direction indicate by the arrow d1 (namely, in the direction indicated by the arrow d2). If the optical displacement meter 6 is shifted by a distance equal to two times of the distance between the intial measuring point 6c and the cross point of said two lines, the initial measuring point 6c and the shifted measuring point 6c on said one line are relatively located in mirror image symmetry with respect to said the other line. Thus, the shifted measuring point is not located on the line along which the paste applying point 4a is moved.

Figure 16:
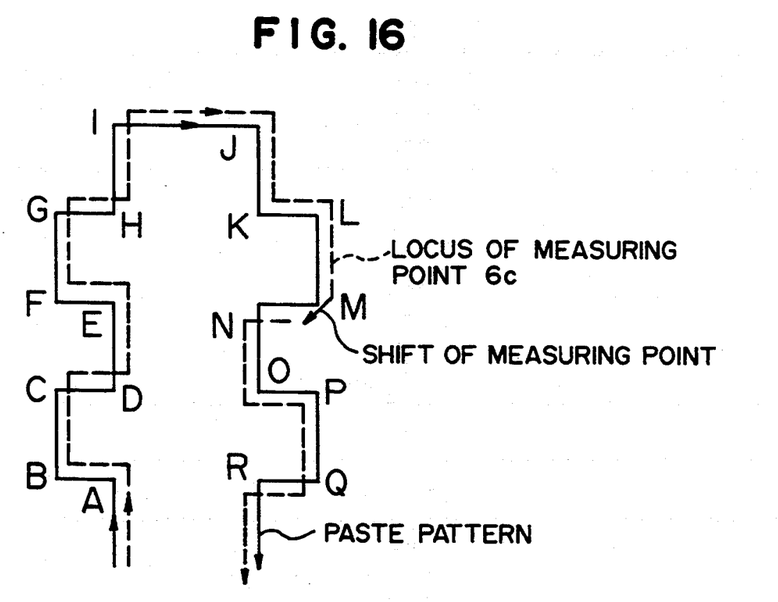
FIG. 16 is a plan view of a substrate, illustrating the positional relation between the paste applying point and the measuring points which shift according to the directions of the movement of the substrate during pattern drawing performed in the positional relation between the paste applying point and the measuring points shown in FIG. 15.

FIG. 16 illustrates a paste pattern drawn by a paste pattern drawing apparatus shown in FIG. 15. In FIG. 16, the solid line indicates the paste pattern, while the broken line indicates the locus of the measuring point 6c which moves together with the nozzle 4. According to this embodiment a complicated pattern including a battlement shape shown in the figure can be easily drawn by shifting the measuring point only at a corner M.

As described above, according to the present invention, the clearance between the tip of the nozzle and the substrate can be measured with high accuracy during drawing of not only rectangular patterns but also any other desired patterns. Therefore, paste patterns formed by paste lines having a consistent sectional shape along the entire lengths thereof can be obtained.

What is claimed is:

1. A paste pattern drawing apparatus including:
a table having a top portion which supports a substrate:
a paste container for containing paste;
a nozzle connected to said paste container and having a paste discharging opening which faces a top surface of the substrate supported by said table;
means for moving at least one of said table and said nozzle relative to the other so that relative movement between said table and said nozzle can be effected in at least two directions perpendicular to each other;
said paste being discharged from said nozzle while said at least one of said table and said nozzle is moved relative to the other so that a desired pattern of said paste is drawn on said substrate;
optical displacement measuring means for measuring a clearance between said substrate and said paste discharging opening of said nozzle at a measuring point on said substrate; and
clearance adjusting means for adjusting the clearance between said substrate and said paste discharging opening of said nozzle according to a result of the measurement provided by said optical displacement measuring means so that said clearance is maintained at a desired distance;

wherein said measuring point of said optical displacement measuring means is positioned on a first line on said substrate passing through a paste applying point on said substrate to which the paste discharged from said nozzle falls and said first line having a certain angle which is substantially 45° to a second line on said substrate passing through said paste applying point and being parallel to a direction of the relative movement of said substrate and said nozzle, and said measuring point being spaced by a desired distance from said paste applying point.

2. A paste pattern drawing apparatus according to claim 1, wherein said means for moving can effect relative movement of said optical displacement measuring means together with said nozzle relative to said substrate in said at least two directions perpendicular to each other.

3. A paste pattern drawing apparatus according to claim 2, further comprising means for moving said optical displacement measuring means relative to said nozzle so as to move said measuring point such that said measuring point precedes said paste applying point as viewed in the direction in which said nozzle is moved relative to said substrate.

4. A paste pattern drawing apparatus according to claim 2, further comprising means for moving said optical displacement measuring means relative to said nozzle so as to move said measuring point obliquely to the direction of relative movement of said nozzle with respect to said substrate.

5. A paste pattern drawing apparatus according to claim 4, further comprising means for moving said optical displacement measuring means relative to said nozzle so as to move said measuring point such that said measuring point precedes said paste applying point as viewed in the direction in which said nozzle is moved relative to said substrate.

* * * * *